(12) United States Patent
Nemazie et al.

(10) Patent No.: US 8,935,599 B2
(45) Date of Patent: *Jan. 13, 2015

(54) METHOD FOR REDUCING EFFECTIVE RAW BIT ERROR RATE IN MULTI-LEVEL CELL NAND FLASH MEMORY

(71) Applicant: Avalanche Technology, Inc., Fremont, CA (US)

(72) Inventors: Siamack Nemazie, Los Altos Hills, CA (US); Anilkumar Mandapuram, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/180,286

(22) Filed: Feb. 13, 2014

(65) Prior Publication Data

US 2014/0281825 A1    Sep. 18, 2014

Related U.S. Application Data

(63) Continuation of application No. 13/840,327, filed on Mar. 15, 2013, now Pat. No. 8,656,255.

(51) Int. Cl.
*H03M 13/00* (2006.01)
*G06F 11/10* (2006.01)

(52) U.S. Cl.
CPC ........ *G06F 11/1068* (2013.01); *G06F 11/1076* (2013.01); *G06F 11/1072* (2013.01); *G06F 11/1008* (2013.01)
USPC .......................................... 714/782; 714/763

(58) Field of Classification Search
CPC ............ G06F 11/1068; G06F 11/1072; G06F 11/1076; G06F 11/1008
USPC ........................................ 714/752, 763, 782
See application file for complete search history.

(56) References Cited

U.S. PATENT DOCUMENTS

| | | | |
|---|---|---|---|
| 7,590,795 B2 * | 9/2009 | Sinclair et al. | 711/103 |
| 7,984,360 B2 * | 7/2011 | Sharon et al. | 714/766 |
| 8,397,127 B2 * | 3/2013 | Otsuka | 714/758 |
| 8,473,809 B2 * | 6/2013 | Wan et al. | 714/763 |
| 8,726,140 B2 * | 5/2014 | Chang et al. | 714/800 |

* cited by examiner

*Primary Examiner* — Esaw Abraham
(74) *Attorney, Agent, or Firm* — Maryam Imam; IPxLaw Group LLP

(57) ABSTRACT

A memory system includes a flash subsystem for storing data identified by page numbers. The memory system further includes a central processing unit (CPU), and a flash controller coupled to the CPU, the CPU being operable to pair a lower with an upper page. Further included in the memory system is a buffer including a page of data to be programmed in a block of the flash subsystem, wherein split segments of pages are formed and concatenated with split error correcting code (ECC), the ECC having a code rate associated therewith.

25 Claims, 6 Drawing Sheets

METHOD FOR REDUCING EFFECTIVE RAW BIT ERROR RATE IN MULTI-LEVEL CELL NAND FLASH MEMORY

CROSS REFERENCE TO RELATED APPLICATIONS

This application is a continuation of U.S. patent application Ser. No. 13/840,327, filed on Mar. 15, 2013, by Siamack Nemazie, now U.S. Patent No. 8,656,255, which issued on Feb. 18, 2014, and entitled "Method for reducing Effective Raw Bit Error Rate in Multi-Level Cell NAND Flash Memory".

BACKGROUND OF THE INVENTION

1. Field of the Invention

This invention relates generally to memory systems, and particularly to Multi Level Cell (MLC) NAND flash memory and other types of storage devices using the same.

2. Background

Flash memory is a block-based non-volatile memory with each block organized into and made of various pages. For all practical purpose flash memory require sequential programming of pages within a block. A NAND flash memory is an array of cells organized in rows and columns. A group of cell in a row of array form a page. A page is unit of programming. A Multi Level Cell NAND flash Memory can be programmed to more than two threshold levels and hence can store more than one information bit. For example a four level cell can store two bits per cell, a first bit and a second bit, and an eight level cell can store 3 bits of information. Without loss of generality we will use an MLC with four level that can store two information bits per cell in the discussion that follows. The information bits are stored by programming cell threshold levels. that is the memory cell has a threshold voltage in any one of four threshold voltage distributions corresponding to one of four states indicating data "11", data "10", data "00", and data "01", respectively. The group of first bits of a page of MLC NAND flash are referred to as lower page and the group of second bits of a page are referred to as an upper page. (for 3 bit per cell MLC we have lower, middle and upper page, corresponding to first, second and third information bits). This is one conventional naming of pages that is adopted in this application, other naming of pages all fall within the scope and spirit of the invention. One basic programming scheme is multi-page programming scheme. In multi-page programming scheme only one page is programmed into a MLC cell during each programming operation. As mentioned before the pages are programmed sequentially, but the upper page and lower page of a page of cells are not generally sequential page addresses. The relation between the page address of a lower page and upper page is generally dependant on manufacturer and part number. Table 1 below shows an exemplary correspondence between page number and lower/upper page of a page of cells for a flash having blocks with 128 pages and 64 pages of cells. In table below "Lower Page k (Lk)" referrers to lower page of $k^{th}$ page of cells and similarly "Upper Page k U(k)" referrers to upper page of $k^{th}$ page of cells.

TABLE 1

| Page # | Lower/Upper page # |
|---|---|
| 0 | Lower Page 0 (L0) |
| 1 | Lower Page 1 (L1) |

TABLE 1-continued

| Page # | Lower/Upper page # |
|---|---|
| 2 | Upper Page 0 (U0) |
| 3 | Lower Page 2 (L2) |
| 4 | Upper Page 1 (U1) |
| 5 | Lower Page 3 (L3) |
| 6 | Upper Page 2 (U2) |
| ... | ... |
| ... | ... |
| 121 | Lower Page 61 (L61) |
| 122 | Upper Page 60 (U60) |
| 123 | Lower Page 62 (L62) |
| 124 | Upper Page 61 (U61) |
| 125 | Lower Page 63 (L63) |
| 126 | Upper Page 62 (U62) |
| 127 | Upper Page 63 (U63) |

Table 2 below shows another exemplary correspondence between page number and lower/upper page of a page of cells for a flash having blocks with 128 pages and 64 pages of cells.

TABLE 2

| Page # | Lower/Upper page # |
|---|---|
| 0 | Lower Page 0 (L0) |
| 1 | Lower Page 1 (L1) |
| 2 | Lower Page 2 (L2) |
| 3 | Lower Page 3 (L3) |
| 4 | Upper Page 0 (U0) |
| 5 | Upper Page 1 (U1) |
| 6 | Lower Page 4 (L4) |
| 7 | Lower Page 5 (L5) |
| 8 | Upper Page 2 (U2) |
| 9 | Upper Page 3 (U3) |
| ... | ... |
| ... | ... |
| 118 | LowerPage 60 (L60) |
| 119 | Lower Page 61 (L61) |
| 120 | Upper Page 58 (U58) |
| 121 | Upper Page 59 (L59) |
| 122 | LowerPage 62 (L62) |
| 123 | Lower Page 63 (L63) |
| 124 | Upper Page 60 (U60) |
| 125 | UpperPage 61 (U61) |
| 126 | Upper Page 62 (U62) |
| 127 | Upper Page 63 (U63) |

In MLC NAND flash, Gray mapping is widely employed, to map l bits to one of $2^l$ levels in a cell, to reduce the overall bit error rate. In NAND Flash, dominant errors are mainly from misdetection of two adjacent levels, which results in just one bit error among l bits under Gray mapping.

FIG. 1 shows a prior art exemplary process of multi-page programming for 2 bits/cell NAND flash employing gray coding. In the first step, the cell is programmed according to the first bit to be stored. If the first bit is 1, the cell should not be programmed and will stay in erased state. Otherwise, it will be programmed to a temporary level which is an intermediate state to transit to levels with index 00 and 01. In the second step, when to program the second bit, the first bit stored in this cell is sensed first, and then programming operation will be executed to program this cell to a level which is determined with the sensed result and the second bit to be programmed.

NAND memories are not intrinsically error-free but rely on error correction coding (ECC) to correct raw bit errors. Generally the ECC circuit is not on the NAND and located in a Flash Controller. The ECC performs encoding and decoding of codewords. Generally the encoding is systematic that is the codeword consists of data and redundancy appended to data. The page data is split into one or more segments and the redundancy for each segment appended to the segment and all segments written to a page. Few examples a BCH code correcting 60 bits in a segment of 1032 bytes would require 105 parity bits for a code rate of 0.907, another BCH code correcting 120 bits in a segment of 2064 bytes would require 225 parity bits for a code rate of 0.901.

FIG. 2a shows a prior art exemplary page layout were page data is split into N segments and segment data and redundancy are written to a page (for page address i). In FIG. 2b the segments in the prior art page layout are shown further split to a first part and a second part which makes no difference at all to the prior art but would help in the description of one embodiment of the invention that will be discussed later.

However, bits stored in each MLC memory cell are subject to different bit error rates. We can see the second bit's (upper page) error rate is two times that of first bit (lower page) (see "Techniques for embracing intra-cell unbalanced bit error characteristics in MLC NAND flash memory" by G. Dong December 2010 IEEE). In current practice, bits stored in upper and lower pages are protected using the same ECC tuned for the worst-case upper page bit error rate scenario, which results in over-protection for lower pages and not effectively using the ECC power on the lower page.

What is needed is a storage system with increased reliability.

SUMMARY OF THE INVENTION

Briefly, in accordance with one embodiment of the invention, in a memory system where memory data are identified using page numbers, a lower page (page numbers) is paired with an upper page. A page of data in a buffer to be programmed in a block is assigned to a page of the block. Split segments of pages are formed and concatenated with split error correcting code (ECC), the ECC having a code rate associated therewith. In an embodiment of the invention, the ECC is computed for concatenation of the split segment from a lower page with the corresponding split segment in the paired upper page. Split ECC are saved in the buffer and pages of data along with associated ECC are written to flash in sequential order, thereby reducing the error rate of the segment corrected by the ECC hence increasing ECC effectiveness at the same code rate. In some embodiments, the paired lower pages and upper pages are on the same dice.

In another embodiment of the invention, the paired lower pages and upper pages are in different flash dies, thereby allowing substantially concurrent read of the split segment and split ECC, more specifically first blocks of two flash dies are paired and then the lower/upper pages of a block of a first dice is paired with the upper/lower pages of the paired block of the second dice. In yet another embodiment of the invention, the paired lower pages and upper pages are in different flash dies on different flash channels, thereby allowing for substantial concurrent read and transfer of the split segment and split ECC, more specifically first blocks of two flash dies are paired and then lower/upper pages of a block of first die is paired with the upper/lower pages of the paired block of the second die.

In yet another embodiment of the invention, lower pages are paired with upper page, a page of data in the buffer to be programmed in a block is assigned to a page of block, segments of pages are formed and concatenated with ECC, the ECC is computed for the concatenation of the segment from lower page with the corresponding segment in the paired upper page, ECC are saved in buffer and pages of data and associated ECC written to flash in sequential order, thereby reducing the error rate on the segment covered by the ECC hence improving ECC effectiveness.

In yet another embodiment of the invention, a Multi Level Cell has 3 bits per cell (8 levels) includes a lower, middle and upper page. Lower pages are paired with upper pages, a page of data in the buffer to be programmed in a block is assigned to a page of blocks (lower, middle or upper). Segments of lower and upper pages are formed and concatenated with ECC, wherein for lower and upper pages, the ECC is computed of the concatenation of the segment from a lower page with the corresponding segment in the paired upper page, and the ECC is saved in the buffer. For a middle page, the ECC is computed for two sequential segments from the same middle page. Pages of data and associated ECC are written to flash in sequential order, thereby reducing the error rate of the segment covered by the ECC hence increasing ECC effectiveness.

These and other objects and advantages of the invention will no doubt become apparent to those skilled in the art after having read the following detailed description of the various embodiments illustrated in the several figures of the drawing.

IN THE DRAWINGS

Figure 4:
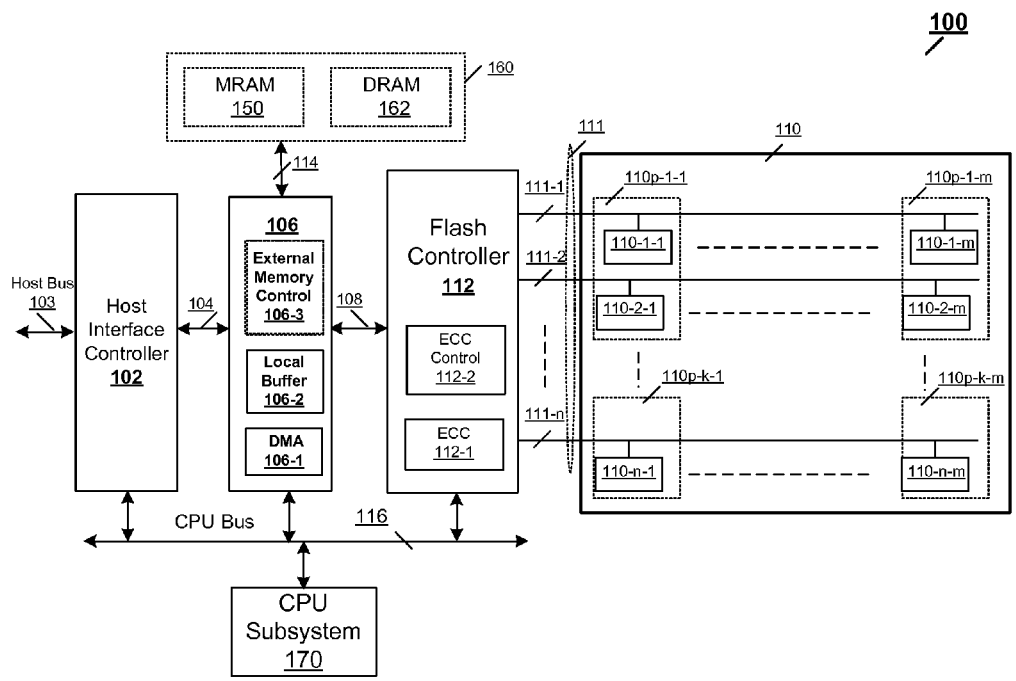
FIG. 4 shows a flash based solid state mass storage device according to yet another embodiment of the invention.
Figure 5A:
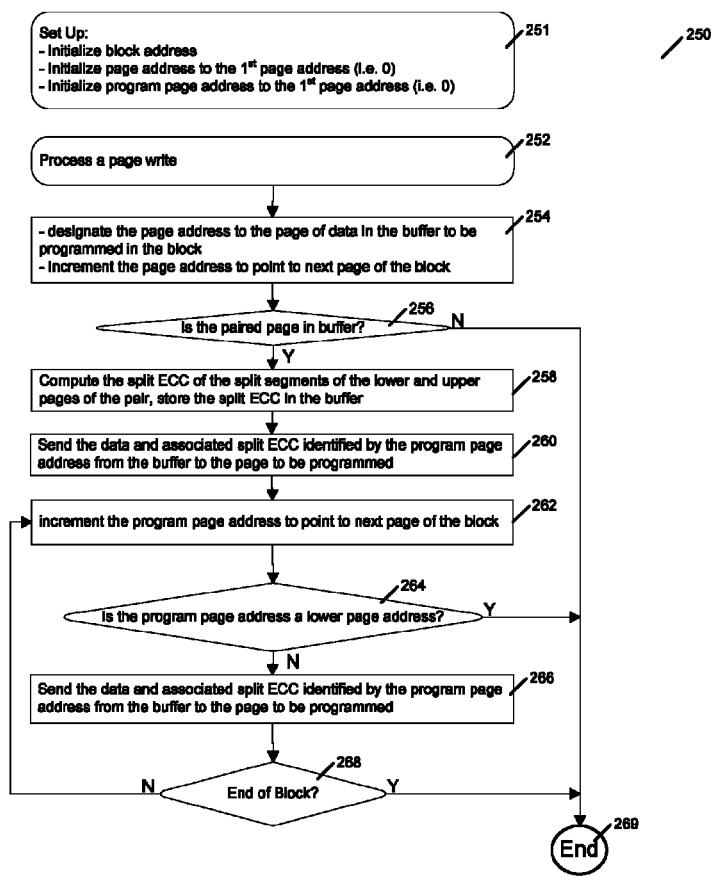

FIG. 5a shows a flow chart of the relevant steps performed by the CPU subsystem 170, ECC control 112-2 and ECC 112-1 of FIG. 4 during a programming (or "writing") operation to the flash subsystem 110, in accordance with an exemplary method of the invention.

Figure 5B:
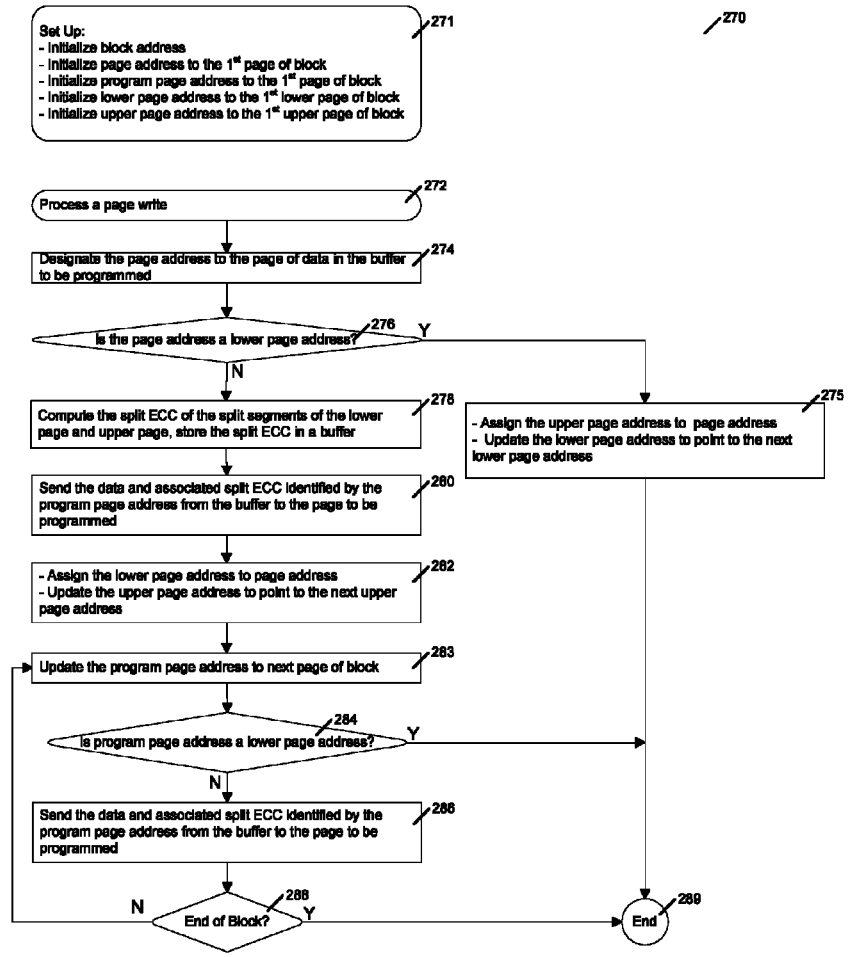

FIG. 5b shows a flow chart of the relevant steps performed by the CPU subsystem 170, ECC control 112-2 and ECC 112-1 of FIG. 4 during a programming (or "writing") operation to the flash subsystem 110, in accordance with an another exemplary method of the invention.

Figure 6:
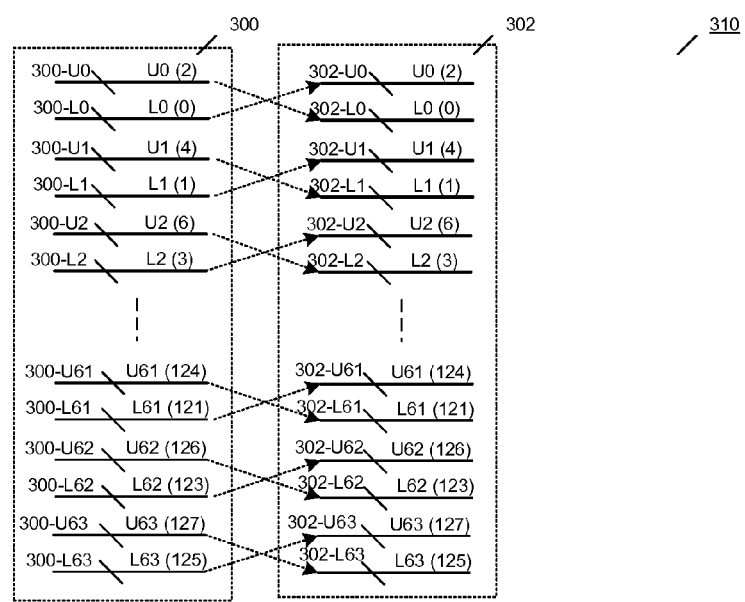

FIG. 6 shows two page address of two paired block in two flash devices of the flash subsystem 110, which pair either a lower address, as denoted by "L" of one block, with an upper address, as denoted by "U" of another block.

Figure 7:
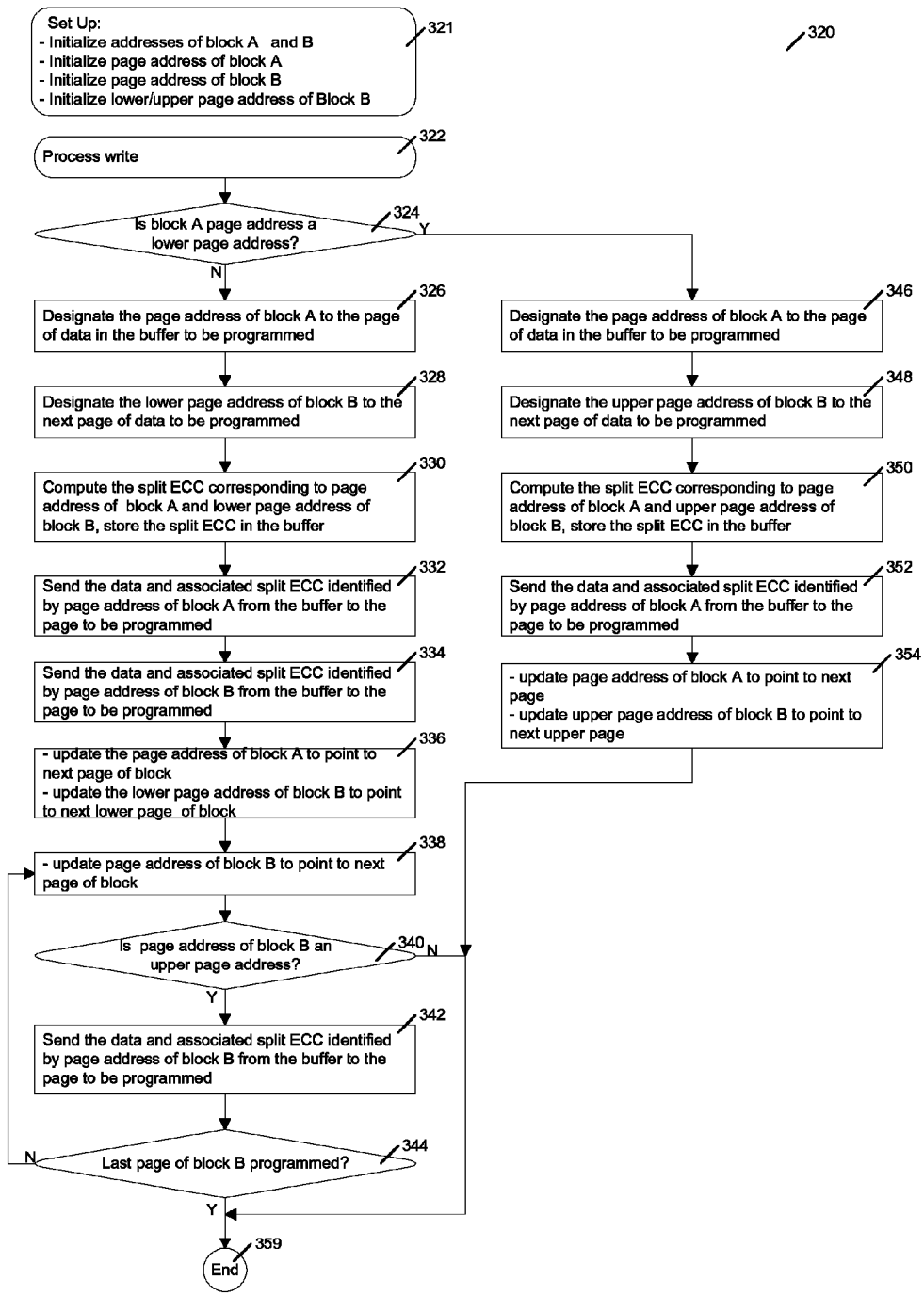

FIG. 7 shows the steps performed by the t CPU subsystem 170, ECC control 112-2 and ECC 112-1 of FIG. 4 during a programming (or "writing") operation to the flash subsystem 110, in accordance with an yet another exemplary method of the invention.

DETAILED DESCRIPTION OF THE VARIOUS EMBODIMENTS

As will be evident in the various embodiments of the invention, a storage device is disclosed to utilize and increase the effectiveness thereof by either correcting a higher raw bit error rates or reducing a code rate associated with error correction coding (ECC).

Figure 3A:
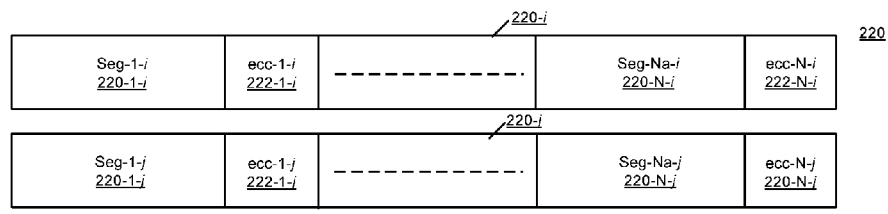
FIG. 3a shows a page layout according to one embodiment of the invention.

FIG. 3a shows page layouts of a paired lower page and upper page according to one embodiment of the invention. The page data is shown split into one or more segments (220-1-*i* to 220-N-i with "N" being an integer value and "i" being an integer value) in a lower page 220-*i* and corresponding segments (segments 220-1-*j* to 220-N-j) in upper page 220-*j*. The ECC is computed by the concatenation of a segment from a lower page with a corresponding segment of the paired upper page. The computed ECC is split into two halves (either half is referred to herein as "Split ECC"), the first half redundancy (split ECC) (222-1-*i* to 222-N-i) is appended to the lower page segment (220-1-*i* to 220-N-i) and the second half redundancy (split ECC) (222-1-*j* to 222-N-j) is appended to the corresponding upper page segment (220-1-*j* to 220-N-j). A code rate, associated with the ECC as commonly known, is slightly lower than prior art code rates (from the example in the background section a code rate of 0.901 vs. 0.907 for prior art) but even more advantageously, the correction power that is not utilized previously (full correction power is not required for lower page) can be used to correct more errors in the upper page split segment.

Figure 3B:
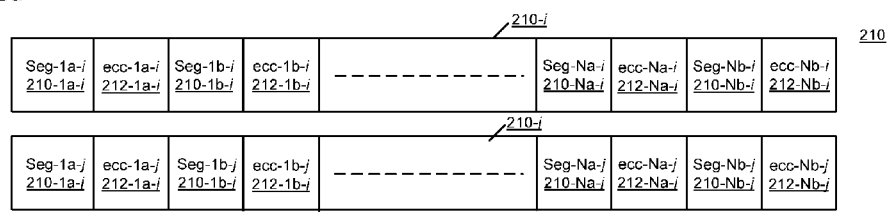
FIG. 3b shows a page layout according to another embodiment of the invention.

FIG. 3*b* shows page layouts of a paired lower page and upper page according to another embodiment of the invention. The page data is split into one or more segments and each segment is split into two halves (either halves are referred to as "Split Segment"), split segments (210-1*a-i*, 211-1*b-i* to 210-Na-I, 210-Nb-i) in lower page 210-*i* and corresponding split segments (split segments 210-1*a-j*, 210-1*b-j* to 210-Na-j, 201-Nb-j) in upper page 210-*j* the ECC is computed for the concatenation of a split segment from lower page with the corresponding split segment being in the paired upper page, the computed ECC being split into two halves, the first half redundancy (split ECC 212-1*a-i* to 212-Na-i) is appended to the lower page split segment and the second half redundancy (split ECC 212-1*a-j* to 212-Na-j) is appended to the corresponding upper page split segment. The correction power of the code that is not utilized previously (full correction power is not required for lower page) can be advantageously used to correct more errors in the upper page split segment than realized by prior art techniques.

The ECC is well known in the art examples of which are the Bose-Chaudhuri-Hocquenghem (BCH) code or the Low Density Parity Check (LDPC) Code.

In accordance with an embodiment of the invention, the paired lower and upper pages are in the same block. In another embodiment of the invention the paired lower and upper pages are in the same block and more specifically lower and upper pages of the same page of cells.

In the discussions to follow without loss of generality examples and illustrations are used employing NAND flash devices having blocks with 128 pages and 64 pages of cells with correspondence between page number and lower/upper page of a page of cells, as shown in the Table 1. The lower and upper pages are not sequential pages. The pages of data must be kept in a buffer until the paired page of data is available so the split ECC for segments (or split segments) can be computed and saved in the buffer, and the available pages are written to flash sequentially.

In one embodiment, the paired pages are made of lower and upper pages of the same page of cells and the pages of data to be programmed in a block are assigned to sequential page addresses that are as follows: Lower Page 0 (page 0), Lower Page 1 (page 1), Upper Page 0 (Page 2), Lower Page 2 (page 3), Upper Page 1 (page 4), Lower Page 3 (page 5), . . . Upper Page 62 (page 126), Upper Page 63 (page 127). A flow chart, shown and discussed relative to FIG. 5*a* shortly, discloses the relevant steps for assigning the pages of data to be programmed into a block sequentially wherein the paired lower and upper pages are lower and upper pages of the same page of cells.

In another embodiment of the invention, the paired pages are lower and upper pages of the same page of cells and the pages of data to be programmed in a block are assigned sequentially to lower and upper pages that is: Lower Page 0 (page 0), Upper Page 0 (page 2), Lower Page 1 (Page 1), Upper Page 1 (page 4), Lower Page 2 (page 3), Upper Page 2 (page 6), . . . Lower Page 63 (page 125), Upper Page 63 (page 127). In accordance with another exemplary method of the invention, as shown and discussed shortly relative to FIG. 5*b*, the paired lower and upper pages are lower and upper pages of the same page of cells, and the pages of data to be programmed in a block are assigned sequentially to lower and upper pages.

In yet another embodiment of the invention, the paired lower pages and upper pages are in different flash dies, thereby allowing concurrent read of the split segments and split ECC, more specifically flash dies are paired and blocks of the paired flash dies are also paired and then lower/upper pages of a block are paired with the upper/lower pages of the paired block.

In yet another embodiment of the invention, the paired flash dies are on different flash channels, thereby allowing concurrent transfer as well as concurrent read of the split segment and split ECC, more specifically flash dies on different flash channels are paired and blocks of the paired flash dies are also paired and then lower/upper pages of a block are paired with the upper/lower pages of the paired block.

FIG. 4 shows an embodiment of the invention, for economy of presentation optional devices which are variation of the embodiment will be described as well.

Referring now to FIG. 4, a solid state storage device 100 is shown to include a host bus 103, a host interface controller 102, a buffer memory control 106, a flash controller 112, a flash subsystem 110, an optional buffer subsystem 160, and a central processor unit (CPU) subsystem 170, in accordance with an embodiment of the invention.

The host bus 103 is shown coupled to the host interface controller 102 and the host interface controller 102 is shown coupled to the buffer memory control 106 through the host controller bus 104 and the buffer memory control 106 is shown coupled to the flash controller 112 through the flash controller bus 108. The buffer memory control 106 is further shown coupled to the buffer subsystem 160 through the buffer memory bus 114. The buffer memory control 106 and the flash controller 112 are each shown coupled to the CPU subsystem 170 through the CPU bus 116. The flash controller 112 is shown coupled to the flash subsystem 110 via flash interface 111.

The management of blocks within the flash subsystem 110, is referred to herein as "flash block management" and includes: Logical to Physical Mapping; Defect management for managing defective blocks (blocks that were identified to be defective at manufacturing and grown defective blocks thereafter); Wear leveling to keep program/erase cycle of blocks within a band; Keeping track of free available blocks; and Garbage collection for collecting valid pages from a plurality of blocks (with a mix of valid and invalid page) into one block and in the process creating free blocks. The flash block management requires maintaining various tables referred to as flash block management tables (or "flash tables"). In the embodiment of FIG. 4, the CPU subsystem 170 manages the flash block management.

The host interface controller 102 communicates with one or more hosts via host bus 103 and manages the host interface protocol. The buffer memory control 106 is shown to include a Direct Memory Access (DMA) 106-1, a local buffer 106-2 and an external memory control 106-3 for controlling access to the (optional) buffer subsystem 160. The buffer memory control 106 transfers data between the local buffer 106-2 or memory subsystem 160 and the host bus 103, Flash interface 111 and the CPU subsystem 170. The (optional) buffer subsystem 160 stores user and system management information. The flash interface controller 112 interfaces with flash subsystem. The flash 110 is used as persistent storage for storage of data. The CPU subsystem 170 controls and manages and execution of host commands.

The flash subsystem 110 is shown to include a number of flash memory components or devices (110-1-1 to 110-1-*m*, ... 110-*n*-1 to 110-*n*-*m*, n, and m being integers) which can be formed from a single semiconductor or die or from a number of such dies. The flash subsystem 110 is shown coupled to the flash controller 112 via flash interface 111. The Flash interface 111 includes of one or more flash channels 111-1 to 111-*n*. 1.

Figure 1:
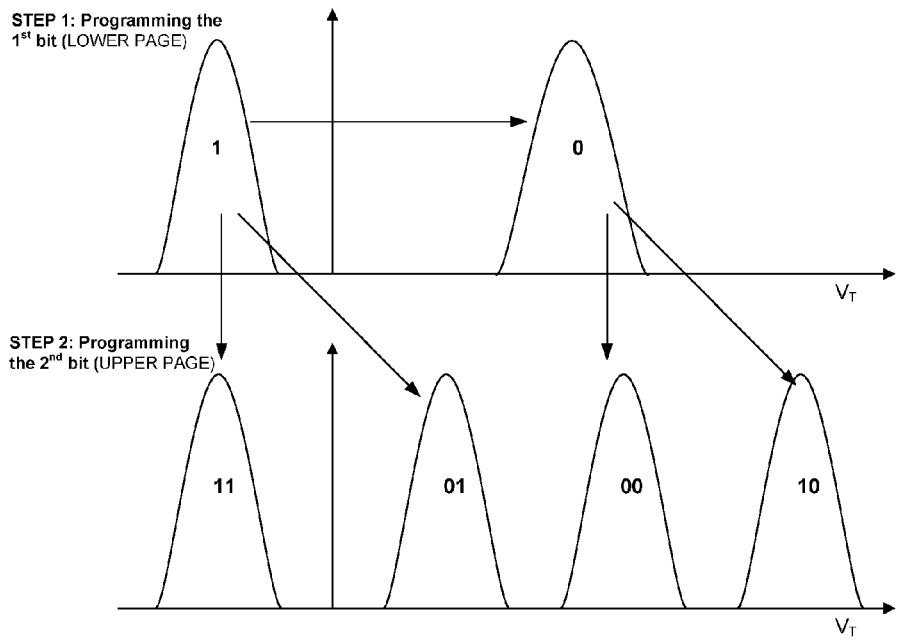
FIG. 1 shows a prior art exemplary process of multi-page programming for 2 bits/cell NAND flash employing gray coding.
Figure 2A:
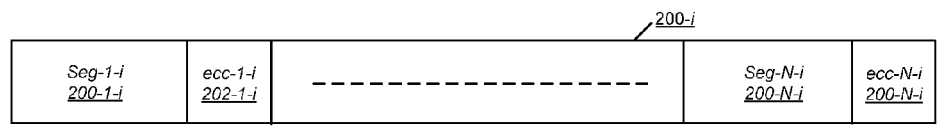
FIG. 2a shows a prior art exemplary page layout.
Figure 2B:
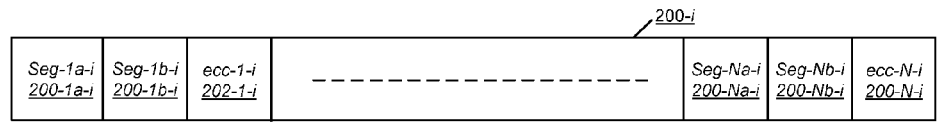
FIG. 2b shows a prior art exemplary page layout where a segment is shown split to a first part and a second part.

In some embodiments, the buffer subsystem 160 is optional and in its place, the local buffer 106-2 is used. The buffer subsystem 160 can take on various configurations. In some configurations, it includes DRAM and in others, it includes MRAM and in yet others, such as that which is shown in FIG. 1, it includes DRAM 162 and the MRAM 150.

In the embodiment of FIG. 4, the buffer subsystem 160 is shown to include the DRAM 162 and the MRAM 150, both of which are coupled to control 106 via a single interface bus, the BM-Bus 114. In other embodiments, this bus is made of two busses, one for the DRAM 162 and the other for the MRAM 150. The CPU subsystem 170 can access the buffer system 160 or local buffer 106-2 concurrently with other accesses. CPU accesses to buffer subsystem 160 are interleaved with host bus 103 and flash interface 111 accesses to the buffer subsystem 160 or local buffer 106-2.

In some embodiments, the MRAM 150 is made of spin transfer torque MRAM (STTMRAM) cells and in other embodiments, it is made of other magnetic memory cells.

As known in the art a problem with volatile memory (such as DRAM or SRAM) for storing data is power fail prior to writing data in volatile memory to the flash subsystem 110, requiring a battery-backed volatile memory or a flash backed memory. In a flash-backed memory, a capacitor (specifically a supercapacitor) provides backup power for a short interval after power fail/shut down, sufficient to save critical data (data that can not be lost prior to saving in a non-volatile memory in the event of a power fail or shut down or a system crash) in a (volatile) memory to a non-volatile flash memory. In accordance with one embodiments of the invention the buffer (local buffer 106-2 or DRAM 162) is flash-backed, that is the critical data in buffer is saved in a designated area of the flash subsystem 110 in the event of a power fail or shut down or a system crash, a capacitor (specifically a supercapacitor) provides backup power for a short interval after power fail/shut down/crash, sufficient to save critical data in volatile memory to flash subsystem 110. In accordance with another embodiment of the invention, the buffer is a (non-volatile) Magnetic Random Access Memory (MRAM) where data along with state information (such as a journal or log as is known in the art) is written. On power up, during initialization the state information is read and any pending write in the MRAM which was not completed due to a power fail/shut down/crash will be completed. In yet another embodiment the MRAM is a Spin Torque Transfer MRAM (STT MRAM).

FIG. 5*a* shows a flow chart of the relevant steps performed by the CPU subsystem 170, ECC control 112-2 and ECC 112-1 of FIG. 4 during a programming (or "writing") operation to a block in the flash subsystem 110, in accordance with an exemplary method of the invention.

As mentioned earlier, FIG. 5*a* shows a flow chart of a method wherein the paired lower and upper pages are lower and upper pages of the same page of cells, and the pages of data to be programmed in a block are assigned sequentially. At step 251, where initialization of the takes place, block address is initialized and the page address is initialized to the first page of the block (page 0), program page address is initialized to the first lower page of the block (page 0).

The steps for writing a page to the block is initiated at step 252. Next, in FIG. 5*a*, at step 254, the page address is assigned to the page of data in the buffer (such as local buffer 106-2), which is to be written to the block, and then the page address is incremented to point to next page of the block. Next, at step 256, at step 256 a determination is made if the paired page associated with program page address has been designated. If at step 256 a determination is made that paired page is not yet designated the process goes to step 269 and exits. If at step 256 a determination is made that the paired page is designated the process moves to step 258. Next at step 258, a split ECC is computed for split segments of the lower page and upper pages of the pair and the split ECC is stored in the buffer.

Next, at step 260, the data and associated split ECC in the buffer (such as local buffer 106-2) and identified by the program page address is sent and programmed is into the memory, such as the flash subsystem 110 of FIG. 4.

Subsequently, at step 262, the program page address is updated to identify the next or subsequent page of the block. At 264, a determination is made as to whether or not the next page address is the same as a lower page address and if so, the process goes back to step 266 and continues from there. If not, the process continues to step 269 and exits. At step 266, the data and associated split ECC in the buffer (such as local buffer 106-2) and identified by the program page address is sent and programmed is into the memory, such as the flash subsystem 110 of FIG. 4.

Subsequently at step 268, a determination is made as to whether or not the entire block has been programmed and if not the process resumes at step 262, otherwise, the process ends at 269.

FIG. 5*b* shows a flow chart of the relevant steps performed by the CPU subsystem 170, ECC control 112-2 and ECC 112-1 of FIG. 4 during a programming (or "writing") operation to a block in flash subsystem 110, in accordance with another exemplary method of the invention.

As mentioned earlier FIG. 5*b* shows a flow chart of an embodiment wherein the paired lower and upper pages are lower and upper pages of the same page of cells, and the pages of data to be programmed in a block are assigned sequentially to lower and upper pages (for example (0, 2), (1, 4), (3, 6), . . . , (121, 124), (123, 126), (125, 127)). At step 271, where initialization takes place, block address is initialized and the page address is initialized to the first page of the block (page 0), program page address is initialized to the first lower page of the block (page 0), lower page address is initialized to the first lower page of the block (page 0) and lower page address is initialized to the first upper page of the block (page 2). The steps for writing a page to the block is initiated at step 272.

Next, in FIG. 5*b*, at step 274, the page address is assigned to the page of data in the buffer (such as local buffer 106-2), which is to be written to the block. Next at step 276, a determination is made as to whether or not the page address is the same as a lower page address and if so, the process goes back to step 275 and continues from there. If not, the process continues to step 278. At step 275 the value of the upper page address is assigned to the page address and the lower page address is updated to point to the next lower page address, and subsequently the process moves to step 289 and exits.

At step 278, a split ECC is computed for split segments of the lower page and upper page data and stored in the buffer. Next, at step 280, the data and associated split ECC in the buffer (such as local buffer 106-2) and identified by the program page address is sent and programmed is into the memory, such as the flash subsystem 110 of FIG. 4.

Subsequently, at step 282, the value of the lower page address is assigned to the page address and the upper page address is updated to point to the next upper page address.

Subsequently, at step 283, the program page address is updated to identify the next or subsequent page of the block. At 264, a determination is made as to whether or not the t program page address is the same as a lower page address and if so, the process ends at step 289 exists. If not, goes back to step 288 and continues from there. At step 286, the data and associated split ECC in the buffer (such as local buffer 106-2) and identified by the program page address is sent and programmed is into the memory, such as the flash subsystem 110 of FIG. 4.

Subsequently at step 288, a determination is made as to whether or not the entire block has been programmed and if not the process resumes at step 283, otherwise, the process ends at 289.

FIG. 6 shows two paired blocks 300 and 302. Block 300 includes 128 pages and 64 lower page address 300-L0 to 300-L63 and 64 upper page address 300-U0 to 300-U63, the number in parenthesis shows the page address for the corresponding page. Similarly, block 302 includes 128 pages and 64 lower page address 302-L0 to 302-L63 and 64 upper page address 302-U0 to 302-U63, the number in parenthesis shows the corresponding page address. The arrows pointing from the block 300 to the block 302, in FIG. 6, show the pairing of the lower/upper page in one block with upper/lower page in the other. For example, the upper page 300-U0, in block 300, is an upper page address, as denoted by "U0" and the arrow from it to the 302-L0, in block 302, denotes the lower page address of the paired page. It is understood that in other embodiments, the arrows in FIG. 6 may point from the block 302 to the block 300. It is understood that other numbers of pages may be employed in each block and any number of blocks are contemplated.

FIG. 7, which will be discussed later, shows a flow chart of an embodiment wherein lower/upper pages of a block in a NAND flash device are paired with the upper/lower of corresponding pages of the paired block in another NAND flash device. It is understood that other numbers of pages may be employed in each block and any number of blocks are contemplated. FIG. 7 shows the steps performed by the CPU subsystem 170, ECC control 112-2 and ECC 112-1 of FIG. 4 for writing two pages to two blocks in two NAND flash devices flash, in accordance with a method of the invention wherein lower/upper pages of a block in a NAND flash device are paired with the upper/lower of corresponding pages of the paired block in another NAND flash device.

At step 321, the addresses of block A and block B are initialized and the page address of the block A and the page address of the block B are also initialized. Further, the lower or upper page addresses of block B are initialized. The steps for writing a page to the blocks A and B is initiated at step 322.

Next, at 324, a determination is made as to whether or not the page address of block A is a lower page address or not and if so, the process goes to 346, otherwise, the process continues to step 326. At step 346, the page address of block A is assigned to the page of data in the buffer (such as local buffer 106-2), which is to be written to the block A. Subsequently at step 348 the upper page address of block B is assigned to the page of data in the buffer (such as local buffer 106-2), which is to be written to the block B. At step 350, the split ECC is computed for split segments of the page address of block A and upper page address of block B and stored in the buffer. Next, at step 352, the data and associated split ECC in the buffer (such as local buffer 106-2) and identified by the page address of block A is sent and programmed is into the memory, such as the flash subsystem 110 of FIG. 4. Subsequently, at step 354, the page address of block A is updated to the next or subsequent page and the upper page address of the block B is also updated to be the next upper page. Next the process ends at 359.

At step 326, the page address of block A is assigned to the page of data in the buffer (such as local buffer 106-2), which is to be written to the block A. Subsequently at step 328 the lower page address of block B is assigned to the page of data in the buffer (such as local buffer 106-2), which is to be written to the block B.

At step 330, the split ECC is computed for split segments of the page address of block A and lower page address of block B and stored in the buffer. Next, at step 332, the data and associated split ECC in the buffer (such as local buffer 106-2) and identified by the page address of block A is sent and programmed is into the memory, such as the flash subsystem 110 of FIG. 4. Next, at step 334, the data and associated split ECC in the buffer (such as local buffer 106-2) and identified by the page address of block B is sent and programmed is into the memory, such as the flash subsystem 110 of FIG. 4. Subsequently, at step 336, the page address of block A is updated to the next or subsequent page and the lower page address of the block B is also updated to be the next lower page. Next at step 338 the page address of block B is updated to the next or subsequent page of block B.

Next, at 340, a determination is made as to whether or not the page address of the block B is an upper page address and if so, the process continues to the step 342, and otherwise, the process ends at step 359. At step 342, the data and associated split ECC in the buffer (such as local buffer 106-2) and identified by the page address of block B is sent and programmed is into the memory, such as the flash subsystem 110 of FIG. 4. Subsequently at step 344, a determination is made as to whether or not the entire block B has been programmed and if not the process resumes at step 338, otherwise, the process ends at 359.

Although the invention has been described primarily employing a two bit (4-level) per cell flash, the invention applies to more bits per cell such as three bit per cell(8-levels) or four bit per cell (16 levels) or higher. For example, in a 3-bit per Cell (having lower, middle and upper page associated with a page of memory cells), lower pages are paired with upper page, a page of data in the buffer to be programmed in a block is assigned to a page of blocks (lower, middle or upper), segments of lower and upper pages are formed and concatenated with ECC, wherein for lower and upper pages, the ECC is computed for the concatenation of the segment from a lower page with the corresponding segment in the paired upper page, and the ECC saved in buffer. For a middle page, the ECC is computed for two sequential segments from the same middle page. Pages of data and associated ECC written to flash in sequential order, thereby reducing the error rate on the segment covered by the ECC hence increasing ECC effectiveness. In another example, in a 4-bit per Cell (having lower, first middle, second middle and upper page associated with a page of memory cells), lower pages are paired with upper page, a page of data in the buffer to be programmed in a block is assigned to a page of blocks (lower, middle or upper), lower and upper pages are paired together, first middle and second middle also paired together, segments of lower/upper pages and first middle and second middle are formed and concatenated with ECC, wherein for lower and upper pages, the ECC is computed for the concatenation of the segment from a lower page with the corresponding segment in the paired upper page, and same for first middle and second middle and the ECC saved in buffer. Pages of data and associated ECC written to flash in sequential order, thereby reducing the error rate on the segment covered by the ECC hence increasing ECC effectiveness.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A memory system comprising:
    a flash subsystem grouped into pages of data, the pages of data including error correcting code (ECC) and being identified by page numbers, at least some of the pages of data having a lower page of data and an upper page of data, wherein the lower and upper pages of data form a pair;
    a flash controller coupled to the flash subsystem, the flash controller configured to split the ECC; and
    a buffer including a page of data from the at least some of the page of data, the page of data having an upper page of data and a lower page of data and to be programmed into the flash subsystem,
    wherein at least a segment of the upper page of data or at least a segment of the lower page of data is concatenated with a split ECC.

2. The memory system, as recited in claim 1, wherein the flash controller is configured to compute the split ECC and to concatenate the split ECC with the segment of the lower page of data and to concatenate another split ECC with the segment of the upper page of data.

3. The memory system, as recited in claim 1, wherein the flash controller is configured to write pages comprising split segments and associated split ECC to the flash subsystem in sequential order.

4. The memory system, as recited in claim 1, wherein the buffer is a flash-backed memory.

5. The memory system, as recited in claim 1, wherein the buffer includes magnetic random access memory (MRAM).

6. The memory system, as recited in claim 5, wherein the magnetic random access memory (MRAM) is spin transfer torque magnetic random access memory (STTMRAM).

7. The memory system, as recited in claim 1, wherein the flash subsystem includes more than one flash die and is organized into blocks, a first flash die having a first block and a second flash die having a second block, further wherein the lower page of data is in the first block and the upper page of data is in the second block, and the lower page of data of the first block and the upper page of data of the second block are paired causing substantially concurrent reading of the at least one segment of the lower page of data or the at least one segment of the upper page and the split ECC.

8. The memory system, as recited in claim 7, wherein the first flash die and the second flash die are coupled to different flash channels.

9. The memory system, as recited in claim 1, wherein the error correction code (ECC) is a Bose, Chaudhuri, and Hocquenghem (BCH) code.

10. The memory system, as recited in claim 1, wherein the error correction code (ECC) is a low-density parity-check (LDPC) code.

11. The memory system, as recited in claim 1, wherein the flash subsystem is organized into blocks.

12. A memory system comprising:
    a flash subsystem for storing data grouped into pages including error correcting code (ECC), the pages of data being identified by page numbers, at least some of the pages of data including a lower page of data and an upper page of data; and
    a buffer including a page of data, the page of data having at least a segment of an upper page of data and at least a segment of a lower page of data and to be programmed in the flash subsystem,
    wherein the upper page of data or the lower page of data are concatenated with a split ECC.

13. The memory system, as recited in claim 12, wherein a flash controller, coupled to the flash subsystem, is configured to compute the split ECC for concatenation and a split ECC is concatenated with the segment of the lower page of data and another split ECC is concatenated with the segment of the upper page of data.

14. The memory system, as recited in claim 12, further including a flash controller coupled to the flash subsystem and being configured to write pages comprising split segments and associated split ECC to the flash subsystem in sequential order.

15. The memory system, as recited in claim 13, wherein the buffer is a flash-backed memory.

16. The memory system, as recited in claim 12, wherein the buffer includes magnetic random access memory (MRAM).

17. The memory system, as recited in claim 16, wherein the magnetic random access memory (MRAM) is spin transfer torque magnetic random access memory (STTMRAM).

18. The memory system, as recited in claim 12, wherein the flash subsystem includes more than one flash die and is organized into blocks and a first block is in a first flash die and a second block is in a second flash die, further wherein the lower page of data is in the first block and the upper page of data is in the second block, the lower page of data of the first block being paired with the upper page of data of the second block causing substantially concurrent reading of the at least one segment of the lower page of data or the at least one segment of the upper page and the split ECC.

19. The memory system, as recited in claim 18, wherein the first flash die and the second flash die are coupled to different flash channels.

20. The memory system, as recited in claim 12, wherein the error correction code (ECC) is a Bose, Chaudhuri, and Hocquenghem (BCH) code.

21. The memory system, as recited in claim 12, wherein the error correction code (ECC) is a low-density parity-check (LDPC) code.

22. The memory system, as recited in claim 12, further including a CPU subsystem coupled to the flash subsystem.

23. The memory system, as recited in claim 22, wherein the CPU subsystem —is operable to —pair the upper page of data with the lower page of data.

24. The memory system, as recited in claim 12, wherein the flash subsystem is organized into blocks.

25. The memory system, as recited in claim 24, wherein the upper page of data and the lower page of data are paired together.

* * * * *